United States Patent
Ali et al.

(10) Patent No.: US 9,214,604 B2
(45) Date of Patent: Dec. 15, 2015

(54) PLASMONIC IR DEVICES

(71) Applicant: Cambridge CMOS Sensors Limited, Cambridge (GB)

(72) Inventors: Syed Zeeshan Ali, Cambridgeshire (GB); Florin Udrea, Cambridgeshire (GB); Julian Gardner, Warwickshire (GB); Richard Henry Hooper, Cambridgeshire (GB); Andrea De Luca, Cambridgeshire (GB); Mohamed Foysol Chowdhury, Cambridgeshire (GB); Ilie Poenaru, Cambridgeshire (GB)

(73) Assignee: Cambridge CMOS Sensors Limited, Cambridge (GB)

(*) Notice: Subject to any disclaimer, the term of this patent is extended or adjusted under 35 U.S.C. 154(b) by 0 days.

(21) Appl. No.: 14/300,830

(22) Filed: Jun. 10, 2014

(65) Prior Publication Data

US 2014/0291704 A1  Oct. 2, 2014

Related U.S. Application Data

(63) Continuation-in-part of application No. 13/466,626, filed on May 8, 2012, now Pat. No. 8,859,303, which is a continuation-in-part of application No. 12/691,104, filed on Jan. 21, 2010, now Pat. No. 8,410,560.

(51) Int. Cl.
| | |
|---|---|
| H01L 33/00 | (2010.01) |
| H01L 33/34 | (2010.01) |
| H05B 3/26 | (2006.01) |
| G01J 5/12 | (2006.01) |
| G01J 5/08 | (2006.01) |
| H01L 27/15 | (2006.01) |

(52) U.S. Cl.
CPC ............ *H01L 33/34* (2013.01); *G01J 5/0853* (2013.01); *G01J 5/12* (2013.01); *H05B 3/267* (2013.01); *H01L 27/153* (2013.01); *H01L 33/0054* (2013.01); *H05B 2203/032* (2013.01); *H05B 2214/04* (2013.01)

(58) Field of Classification Search
None
See application file for complete search history.

(56) References Cited

U.S. PATENT DOCUMENTS

| | | | |
|---|---|---|---|
| 4,938,244 | A | 7/1990 | Kumada et al. |
| 5,285,131 | A | 2/1994 | Muller et al. |
| 5,291,142 | A | 3/1994 | Ohmi |
| 5,345,213 | A | 9/1994 | Semancik et al. |
| 5,500,569 | A | 3/1996 | Blomberg et al. |
| 5,644,676 | A | 7/1997 | Blomberg et al. |

(Continued)

FOREIGN PATENT DOCUMENTS

| | | |
|---|---|---|
| EP | 2 056 337 A2 | 5/2009 |
| WO | WO 98/32009 | 7/1998 |
| WO | WO 02/080620 A1 | 10/2002 |

OTHER PUBLICATIONS

Co-pending U.S. Appl. No. 13/466,626, filed May 8, 2012.

(Continued)

*Primary Examiner* — Scott B Geyer
(74) *Attorney, Agent, or Firm* — Renner, Otto, Boisselle & Sklar, LLP

(57) ABSTRACT

An infra-red (IR) device comprising a dielectric membrane formed on a silicon substrate comprising an etched portion; and at least one patterned layer formed within or on the dielectric membrane for controlling IR emission or IR absorption of the IR device, wherein the at least one patterned layer comprises laterally spaced structures.

55 Claims, 14 Drawing Sheets

(56) References Cited

U.S. PATENT DOCUMENTS

| | | | |
|---|---|---|---|
| 5,827,438 | A | 10/1998 | Blomberg et al. |
| 5,834,777 | A | 11/1998 | Wong |
| 5,939,971 | A * | 8/1999 | Yong .............................. 338/15 |
| 6,094,127 | A * | 7/2000 | Yong .............................. 338/15 |
| 6,262,417 | B1 * | 7/2001 | Ju .............................. 250/338.1 |
| 6,297,511 | B1 | 10/2001 | Syllaios et al. |
| 6,469,303 | B1 | 10/2002 | Sun et al. |
| 6,597,051 | B2 | 7/2003 | Lubomirsky et al. |
| 6,777,961 | B2 | 8/2004 | Hamamoto et al. |
| 6,924,485 | B2 * | 8/2005 | Kanzaki ..................... 250/338.1 |
| 7,244,939 | B2 | 7/2007 | Stuttard |
| 7,294,836 | B2 * | 11/2007 | Yon et al. .................. 250/338.4 |
| 7,330,336 | B2 | 2/2008 | Luo et al. |
| 7,511,274 | B2 | 3/2009 | Johnson et al. |
| 7,541,587 | B2 | 6/2009 | Cutler et al. |
| 7,825,380 | B2 | 11/2010 | Puscasu et al. |
| 8,017,923 | B2 | 9/2011 | Inoue et al. |
| 8,410,560 | B2 | 4/2013 | Ali |
| 8,492,737 | B2 | 7/2013 | Araci et al. |
| 8,552,380 | B1 | 10/2013 | Florin et al. |
| 2006/0154401 | A1 | 7/2006 | Gardner et al. |
| 2006/0175551 | A1 * | 8/2006 | Fan et al. ....................... 250/353 |
| 2007/0034978 | A1 * | 2/2007 | Pralle et al. .................... 257/432 |
| 2007/0102639 | A1 | 5/2007 | Cutler et al. |
| 2008/0239322 | A1 | 10/2008 | Hodgkinson et al. |
| 2008/0272389 | A1 | 11/2008 | Rogne et al. |
| 2008/0308733 | A1 | 12/2008 | Doncaster |
| 2009/0121137 | A1 * | 5/2009 | Liddiard .................... 250/338.1 |
| 2009/0176064 | A1 * | 7/2009 | Hirano et al. ................ 428/172 |
| 2011/0315981 | A1 * | 12/2011 | Xu et al. ......................... 257/43 |
| 2012/0153151 | A1 * | 6/2012 | Dumont et al. ............ 250/338.1 |

OTHER PUBLICATIONS

Parameswaran et al., "Micromachined Thermal Radiation Emitter from a Commercial CMOS Process", IEEE Electron Device Letters, vol. 12, No. 2, Feb. 1991.
Bauer et al., "Design and fabrication of a thermal infrared emitter", Sensors & Actuators A 55 (1996) 57-63.
Yusasa et al., "Single Crystal Silicon Micromachined Pulsed Infrared Light Source", Transducers 1997, (proceedings of IEEE 1998), 0-7803-3829-4.
Cole et al., "Monolithic Two-Dimensional Arrays of Micromachined Microstructures for Infrared Applications", IEEE Sensors 1998.
Hildenbrand et al., "Micromachined Mid-Infrared Emitter for Fast Transient Temperature Operation for Optical Gas Sensing Systems", IEEE Sensor 2008.
Ji et al., "A MEMS IR Thermal Source for NDIR Gas Sensors", IEEE 2006.
Spannhake et al., "High-temperature MEMS Heater Platforms Long-term Performance of Metal and Semiconductor Heater Materials", Sensors 2006, ISSN 1424-8220, pp. 405-419.
Tu et al., "Micromachined, silicon filament light source for spectrophotometric Microsystems", Applied Optics 2002, vol. 42, No. 13, May 1, 2003.
Graf et al., "Review of micromachined thermopiles for infrared detection", Measurement Science and Technology, 18 (2007) R59-R75.
Fordl et al., "A High-Precision NDIR CO2 gas sensor for automotive applications", IEEE Sensors Journal, vol. 6, No. 6, 2006.
Courbat et al. "Reliability improvement of suspended platinum-based micro-heating elements," Sensors and Actuators A 142 (2008) 284-291.
Liew et al, "Electromigration interconnect lifetime under AC and pulse DC Stress", Proceedings of IEEE Reliability Physics Symposion 1989, pp. 215-219.
Maiz, "Characterisation of electromigration under bidirectional and pulsed unidirectional (PDC) currents", Proceedings of IEEE Reliability Physics Symposion 1989, pp. 220-228.
Garcia-Guzman, "Design and simulation of a smart rationmetric ASIC chip for VOC monitoring", Sensors and Actuators B Nov. 2003, 232-243.
Kim et al., "A new uncooled thermal infrared detector using silicon diode", Sensors and Actuators A, 89 (2001) pp. 22-27.
Eminoglu et al., "Low-cost uncooled infrared detectors in CMOS process", Sensors and Actuators A 109 (2003) pp. 102-113.
Barritault et al., "Mid-IR source based on a free-standing microhotplate for autonomous CO2 sensing in indoor applications", Sensors and Actuators A 172 (2011) pp. 379-385.
San et al., "A silicon micromachined infrared emitter based on SOI wafer", Proceedings of SPIE 2008, vol. 6836, 68360N-1.
Weber et al., "Improved design for fast modulating IR sources", J. Micromech. Microeng. 7 (1997) pp. 210-213.
Shklover et al., "High-Temperature Photonic Structures. Thermal Barrier Coatings, Infrared Sources and Other Applications", Journal of Computational and Theoretical Nanoscience, vol. 5, 2008, pp. 862-893.
Tsai et al., "Two Color Squared-lattice Plasmonic Thermal Emitter", Proceedings of the Sixth IEEE Conference on Nanotechnology, vol. 2, pp. 746-748.
Jiang et al., "Enhancement of thermal radiation in plasmonic thermal emitter by surface plasmon resonance", Proceeding of IEEE conference on Nanotechnology, 2008, pp. 104-107.
Fu et al., "A thermal emitter with selective wavelength: Based on the coupling between photonic crystals and surface plasmon polaritons", Journal of Applied Physics 105, 033505 (2009).
Huang et al., "Triple Peaks Plasmonic Thermal Emitter with Selectable Wavelength Using Periodic Block Pattern as Top Layer", Proceedings of IEEE International Conference on Nanotechnology 2011, pp. 1267-1270.
Daly, "Nano-Structured Surfaces for Tuned Infrared Emission for Spectroscopic Applications", Micro-Nano-photonic Materials and Devices, Joseph W. Perry, Axel Scherer, pp. 80-89 (2000).
Tay et al., "Plasmonic thermal IR emitters based on nanoamorphous carbon", Applied Physics Letters 94, 071113 (2009).
Ikeda et al., "Controlled thermal emission of polarized infrared waves from arrayed plasmon nanocavities", Applied Physics Letters 92, 021117 (2008).
Araci et al., "Mechanical and thermal stability of plasmonic emitters on flexible polyimide substrates", Applied Physics Letters 97, 041102 (2010).
Ji et al., "Narrow-band Midinfrared Thermal Emitter Based on Photonic Crystal for NDIR Gas Sensor", Proceedings of IEEE ICSICT 2010, pp. 1459-1461.
Li et al., "MEMS-based plasmon infrared emitter with hexagonal hold arrays perforated in the Al—$SiO_2$—Si structure", Journal of Micromechanics and Micro-engineering 21 (2011) 105023.
Puscasu et al., "Plasmonic Photonic Crystal MEMS Emitter for Combat ID", Proc. of SPIE, vol. 8031, 80312Y.
Sawada et al., "Surface Plasmon Polariton Based Wavelength Selective IR Emitter Combined with Microheater", proceedings of IEEE conference on Optical MEMS and Nanophotonics 2013, pp. 45-46.
Zoysa et al., "Conversion of broadband to narrowband thermal emission through energy recycling", Nature Photonics 2012, 20.12.146.

* cited by examiner

PLASMONIC IR DEVICES

RELATIONSHIP TO EARLIER APPLICATION

This application is a continuation-in-part of U.S. application Ser. No. 13/466,626 filed on May 8, 2012 which is a continuation-in-part of U.S. application Ser. No. 12/691,104 filed on Jan. 21, 2010, hereby incorporated by reference in their entirety.

FIELD OF THE INVENTION

This invention relates to a thermal Infra-Red (IR) device using a micro-hotplate fabricated on a microchip and enhanced by the use of plasmonic structures. Particularly but not exclusively the invention relates to an IR source and an IR detector comprising plasmonic structures.

BACKGROUND TO THE INVENTION

It is well known to fabricate an IR Emitter based on silicon process. Such devices typically consist of a resistive microheater embedded within a thin membrane and supported on a silicon substrate. When current is passed through the heater, it heats up to a high temperature (which can be as much as 700° C. or even higher), and at this high temperature the device emits Infra Red radiation.

A large number of designs with IR emitters have been reported. For Example, Parameswaran et. al. "Micro-machined thermal emitter from a commercial CMOS process," IEEE EDL 1991 reports a polysilicon heater for IR applications made in CMOS technology, with a front side etch to suspend the heater and hence reduce power consumption. Similarly, D. Bauer et. Al. "Design and fabrication of a thermal infrared emitter" Sens & Act A 1996, also describes an IR source using a suspended polysilicon heater. U.S. Pat. No. 5,285,131 by Muller et al. and patent US2008/0272389 by Rogne et. al, San et. al. "A silicon micromachined infrared emitter based on SOI wafer" (Proc of SPIE 2007) also describe similar devices using a polysilicon heater.

Yuasa et. al "Single Crystal Silicon Micromachined Pulsed Infrared Light Source" Transducers 1997, describe an infrared emitter using a suspended boron doped single crystal silicon heater. Watanabe, in patent EP2056337 describes a suspended silicon filament as an IR source. The device is vacuum sealed by bonding a second substrate.

Many designs based on a platinum heater have also been described. For example, Hildenbrand et. al. "Micromachined Mid-Infrared Emitter for Fast Transient Temperature Operation for Optical Gas Sensing Systems", IEEE Sensor 2008 Conference, reports on a platinum heater on suspended membrane for IR applications.

Similarly Ji et. Al. "A MEMS IR Thermal Source For NDIR Gas Sensors" (IEEE 2006) and Barritault et. al "Mid-IR source based on a free-standing microhotplate for autonomous CO2 sensing in indoor applications" (Sensors & Actuators A 2011), Weber et. al. "Improved design for fast modulating IR sources", Spannhake et. Al. "High-temperature MEMS Heater Platforms: Long-term Performance of Metal and Semiconductor Heater Materials" (Sensors 2006) also describe platinum based as well as other emitters.

Some other IR Emitter designs are given by U.S. Pat. No. 6,297,511 by Syllaios et. al., U.S. Pat. Nos. 5,500,569, 5,644,676, 5,827,438 by Bloomberg et. al, and WO 02/080620 A1 by Pollien et. al.

One limitation of many of these devices is that their emissivity is not optimal. There is also no control over the emission at specific wavelengths. For this purpose, the devices are often coated with different materials to improve the emissivity. Some materials used are metal blacks, carbon, carbon nanotubes and other thin film interference structures. These structures can be difficult to deposit and require additional processing steps. In addition they may degrade over time at high temperatures, and hence limit the operating temperature of the IR emitter.

There have been several reports in literature that suggest that the emissivity of devices can be varied at particular wavelengths by using plasmonic structures, which are periodic structures created on a surface. For example these are described in V. Shklover et. al., "High-Temperature Photonic Structures, Thermal Barrier Coatings, Infrered Sources and Other Applications," Journal of Computational and Theoretical Nanoscience, Vol 5, 2008, pp. 862-893.

There are also several reports of IR emitters with plasmonic structures. For example, M. Tsai et. al., "Two Color Squared-Lattice Plasmonic Thermal Emitter," Proceedings of Sixth IEEE Conference on Nanotechnology, Vol 2, pp 746-748, describes a silver/silicon dioxide/silver sandwich structure on a silicon substrate, where the top silver and/or silicon dioxide layer have a periodic pattern. The emission spectrum of the device shows peaks near 4 µm and 6 µm. Heat is provided by passing current through a gold and chromium layer at the back of the substrate. However, as there is no membrane, the device would consume a lot of power. Very similar devices are also described in Y. Jiang, "Enhancement of thermal radiation in plasmonic thermal emitter by surface plasmon resonance," Proceeding of IEEE conference on Nanotechnology 2008, pp. 104-107, and in H. Fu, "A thermal emitter with selective wavelength: Based on the coupling between photonic crystals and surface plasmon polaritions," Journal of Applied Physics 105, 033505 (2009). S. Huang, "Triple peaks plasmonic thermal emitter with selectable wavelength using periodic block pattern as top layer," Proceedings of IEEE International Conference on Nanotechnology 2011 pp. 1267-1270, also describe a device based on silicon dioxide and silver layers, but using block shapes in different patterns at the top surface. Another device is described by J. Daly et. al. "Nano-Structured Surfaces for Tuned Infrared Emission for Spectroscopic Applications," Micro-Nano-photonic Materials and Devices, Joseph W Perry, Axel Scherer, pp. 80-89, which has a plasmonic structure made of gold with chromium as an underlying layer, and this structure is tested by putting on a graphite sheet ont a hotplate.

S. Tay et. al., "Plasmonic thermal IR emitters based on nanoamorphous carbon," Applied Physics Letters 94, 071113 (2009), and U.S. Pat. No. 8,492,737B2 describe an IR emitter with nanoamorphous carbon patterned at the top as a hexagonal lattice of holes. K. Ikeda et. al, "Controlled thermal emission of polarized infrared waves from arrayed plasmon nano cavities," Applied Physics Letters 92, 021117 (2008) describes a plasmonic IR emitter based on an epoxy substrate. Similarly I. E. Araci et. al. "Mechanical and thermal stability of plasmonic emitters on flexible polyimide substrates," Applied Physics Letters 97, 041102 (2010) describes a plasmonic emitter based on a polyimide substrate. The use of epoxy or polyimide limits the maximum operating temperature of the device.

While these all these designs are made to optimise the emission spectrum of the surface, these devices do not have a proper mechanism for heating up. Either the heater is based on a metal layer at the back surface or need to be couple to an external heater, which can result in very high power consumption. Unlike conventional miniaturised IR emitters, none of these devices are based on a membrane to isolate the heat and reduce power consumption.

There are a number of reports on MEMS based IR emitters with plasmonic structures. X. Ji et. al. "Narrow-band Midinfrared Thermal Emitter Based on Photonic Crystal for NDIR Gas Sensor," Proceedings of IEEE ICSICT 2010, pp. 1459-1461. describes a platinum heater on top of a silicon nitride/silicon dioxide/silicon composite membrane, where all these layers are patterned with an array of holes in a square pattern. F. Li et. al. "MEMS-based plasmon infrared emitter with hexagonal hole arrays perforated in the Al—$SiO_2$ structure," Journal of Micromechanics and Micro-engineering 21 (2011) 105023, describe an aluminium heater on an silicon dioxide/silicon membrane, and all these layers have circular holes in them in a hexagonal pattern. While these designs will have lower power consumption due to the use of a membrane for thermal isolation, making holes through most of the membrane layers requires extra steps, and can also structurally weaken the membrane as many of the layers including the silicon dioxide layers have holes in them.

Puscasu "Plasmonic Photonic Crystal MEMS Emitter for Combat ID," Proc of SPIE Vol 8031, 80312Y, describes a plasmonic structure coupled with a MEMS platform. The plasmonic structure consists of circular holes in a hexagonal pattern, while the platform is a heater suspended on a micro-bridge type membrane. Similarly T. Sawada "Surface Plasmon Polarities Based Wavelength Selective IR Emitter Combined with Microheater," proceedings of IEEE conference on Optical MEMS and Nanophotonics 2013, pp. 45-46, also describes an IR emitter which is suspended. Similarly the device described in U.S. Pat. No. 7,825,380 also describes a plasmonic structure on a suspended heater, which is held together by only two beams. Such suspended structures are less stable than full membrane structures.

M. Zoysa, "Conversion of broadband to narrowband thermal emission through energy recycling," Nature Photonics 2012, 20.12.146, describe an IR emitter based on a gallium arsenide (GaAs) substrate and a membrane consisting of GaAs/Al—GaAs, with the membrane layers pattern into holes in a hexagonal pattern. Gallium arsenide is not as widely used as silicon, and so is more expensive.

STATEMENT OF THE INVENTION

According to one aspect of the present invention, there is provided an Infra-Red (IR) device comprising: a dielectric membrane formed on a silicon substrate comprising an etched portion; and at least one patterned layer formed within or on the dielectric membrane for controlling IR emission or IR absorption of the IR device, wherein the at least one patterned layer comprises laterally spaced structures.

The IR device may be an IR source or emitter. The IR source may be provided in the form of a micro-hotplate device comprising a heater embedded within a dielectric membrane supported on the silicon substrate where there is at least one layer embedded within or on top of the membrane that has a plasmonic layer which is patterned in a periodic structure to improve the emissivity of the IR source at particular wavelengths. It will be appreciated that the term "periodic structure" refers to the arrangement in which a patterned layer has a plurality of laterally spaced structures.

The device is advantageous over state of the art devices as it provides a micro-machined IR source with improved emissivity at the target wavelength while having a low power and mechanically stable structure. Furthermore the device structure may be compatible with standard CMOS processing, and so can be fabricated in a standard CMOS process followed by a back side etch. This results in low fabrication cost, and excellent reproducibility from device to device. The device may be fabricated on a starting bulk silicon wafer or an SOI wafer. The IR source also can be in the form of an array of membranes—closely packed as a result of the use of the deep reactive ion etching technique.

In one example, the at least one patterned layer may be made from a metal, polysilicon or single crystal silicon above or below the heater, or the heater layer itself that is patterned in a periodic structure to enhance the emission at one or more wavelengths or range of wavelengths.

In one embodiment, the device may comprise a dielectric circular membrane supported on a silicon substrate. The membrane may be made of silicon dioxide, with a passivation made of silicon dioxide or silicon nitride. A tungsten heater may be embedded within the membrane, and a plasmonic layer patterned in a periodic structure (or having laterally spaced structures) is above the membrane. Such a structure may be based on a membrane and so has low power consumption. The membrane may be a full "closed" membrane structure (as opposed to a micro-bridge type structure), and there are no holes in the dielectric silicon dioxide/silicon nitride, so the device is more mechanically stable than many of the other state-of-the-art plasmonic IR emitters.

Preferably the device is fabricated in a CMOS processed followed by a post processing of back side etching. In this case, the heater, membrane and the plasmonic layer may be made of fully CMOS layers, without requiring any additional steps in processing, aside from the back side etch. The starting wafer may be a bulk silicon wafer or a silicon on insulator (SOI) wafer.

However, there are many other possible embodiments of the device, and many possible materials and layers are possible. The device can also be fabricated in a non-CMOS process allowing different materials (such as a platinum heater) to be used.

The micro-heater may comprise single crystal silicon, polysilicon, a metal such as platinum, gold or a CMOS metal such as aluminium, copper, molybdenum or tungsten. The dielectric membrane may comprise silicon dioxide, silicon nitride, or different layers of silicon oxide and/or silicon nitride. The heater material may also comprise an adhesion or a diffusion barrier layer below the material, such as titanium and/or titanium nitride. The heater shape may be a circle, a rectangle/square, a meander type shape, or a ring/multiring shape, or a spiral shape.

The membrane may be formed by back etching of the silicon substrate. The back etching may be by Deep Reactive Ion Etching (DRIE) to result in vertical sidewalls of the membrane trench. Alternately the back etching may be performed by anisotropic etching using wet etchants such as Potassium Hydroxide (KOH), or Tetramethylammonium Hydroxide (EMAH), which results in slanting sidewalls of the membrane trench. The membrane shape may be a circle, a rectangle/square or a rectangle/square with rounded corners.

The layer patterned in the periodic structure may comprise (but not limited to) single crystal silicon, polysilicon, metals such as platinum or gold, or CMOS metal such as aluminium, copper, titanium, molybdenum or tungsten. This layer may be either embedded within the membrane, or be above the membrane. The layer may be patterned as a series of circular dots arranged in a hexagonal pattern, a square/rectangular pattern or any other arrangement. However, the dots may be a circle, square, triangle, a trapezoid, rectangle, cross, or any other shape. Alternately the layer may be patterned as a series of holes in a hexagonal or square/rectangular pattern or any other arrangement. The holes may be a circle, square, triangle, a trapezoid, rectangle, cross or any other shape.

The periodicity may be constant from dot to dot (or hole to hole)—i.e. the same distance between each dot (or hole). Alternatively, it can vary in a periodic manner. For example, a pattern where the dot distance changes from dot to dot, but this dot distance pattern may be repeated after a set number of dots. A similar pattern may also be used for a hole pattern.

In the case that the layer forming the heater forms the periodic structure, periodic pattern would be formed only in the areas where there are no heater tracks. Finally, there may be more than one layer that is patterned as a periodic layer—and may be any arrangement of some or all the layers being above or below the heater, or some or all the layers consisting of dot or hole repetitions. Each layer may have the same identical repeat pattern, or a different pattern, or a pattern that is the inverse of the pattern on another layer.

As an example, the plasmonic layer may be designed and patterned to improve the emissivity of the emitter at the absorption wavelengths of Carbon Dioxide ($CO_2$), which absorbs radiation near the 4.26 µm wavelength. The layer pattern would consist of circular dots in a hexagonal pattern. For example, all the circular dots include an identical diameter chosen in the range of 0.5-10 µm, and an identical pitch (centre to centre distance) ranging from 1 µm to 20 µm. The pattern would be an optimum, or close to optimum pattern determined by either numerical analysis, simulation and/or characterisation. Such analysis would show trends such as improvements with smaller or larger diameter or pitch, or the peak optimum point.

Similarly the plasmonic layer may be designed to optimise the structure for other desired wavelengths, for example the absorption wavelengths of methane ($CH_4$) which absorbs near 3.3 µm, Carbon Mono-oxide (CO) which absorbs 4.7 µm, and ethanol ($CH_5OH$) which absorbs at 9.5 µm. Alternately, the plasmonic layer may be designed to increase the emission at a small range of wavelengths, for example in the range of 2-5 µm, or from 5-10 µm.

As another example, where the plasmonic layer is optimised for a particular wavelength, each of the dots may have a diameter that varies by about 10%, and the pitch also varies by about 10%. However this variation is repeated periodically. Such a structure has an advantage that it allows for production tolerances of layer thicknesses and refractive indices.

Another example can be an IR emitter where the plasmonic layer is designed to improve the emissivity over a broad range of wavelength. Such a plasmonic layer may comprise circular dots where the diameter and pitch varies greatly for each dot, for example, diameters varying from 0.5 µm to 10 µm, and pitch varying from 1 to 20 µm. This variation may be repeated periodically.

The membrane may comprise other layer structures as well. For example, a temperature sensor may be embedded within the membrane, and may comprise either a diode, or a metal resistor, or a polysilicon or single crystal silicon resistor. The membrane may also have more than one layer as the heater. Additionally, one or more temperature spreading plate may also be embedded within the membrane and will be formed of single crystal silicon, polysilicon, a metal such as platinum or gold, or a CMOS metal such as aluminium, copper, titanium, molybdenum or tungsten.

The membrane can also have a spreading plate within it. For example a square or circular floating plate of one or more layers of single crystal silicon, polysilicon, or a metal such as gold, platinum, or a CMOS metal such as aluminium, tungsten, copper, molybdenum or titanium. This plate is of a material with a relatively high thermal conductivity and is used to improve the uniformity of the temperature. Other membrane structures of different layers, such as beams may also be used to improve the mechanical robustness of the membrane.

In another example, there may be arrays of such IR emitters on a single chip. The IR emitters may be identical, or may be different in any aspect depending on the design requirements.

The IR device may be an IR detector. The plasmonic layer may be used to improve the absorbance of the IR detector for a particular wavelength, or for a broad range of wavelengths, instead of an IR emitter. This is similar to the IR emitter, except that instead of a heater there is a thermopile embedded within the membrane. The thermopile may comprise multiple thermocouples connected together in series. The thermocouples preferably comprise a single crystal P+ type silicon and single crystal N+ type silicon, having one junction inside the membrane and one junction outside. However, the thermocouples materials may instead comprise polysilicon, a metal such as platinum or a CMOS metal such as tungsten, aluminium, copper, titanium or molybdenum. In the case of polysilicon or single crystal silicon, metals may be used to connect the junctions of two different materials.

The membrane can be either circular or rectangular shaped or can have any other suitable shape. The thermopile may comprise several thermocouples extending from the outside of the membrane to the inside and repeated in a circular manner. Alternately it can comprise two rows of thermocouples. It can also comprise thermocouples extending to the very centre of the membrane from four sides and then additional thermocouples formed closely to these, but with the hot junction moving slightly away from the centre as the space in the centre is filled. The thermocouples may extend all the way to the centre of the membrane or only partway into the membrane. Many other arrangements of thermocouples on the membrane are possible.

The IR detector may have a heater embedded within the membrane. A heat spreading plate may be embedded within the membrane, and may comprise single crystal silicon, polysilicon, a metal such as platinum or gold, or a CMOS metal such as tungsten, aluminium, copper, titanium or molybdenum. A temperature sensor may also be embedded within the membrane, and/or outside the membrane but on the same chip. This temperature sensor can be either a diode, a resistor formed of a metal or polysilicon or single crystal silicon.

The IR detector may be a stand-alone detector, or it may be on the same chip as the IR emitter. In the case of being on the same chip as the IR emitter, one or both of the devices may have a plasmonic layer in them. The device may be fabricated based on a starting SOI wafer or a bulk silicon wafer. Preferably the device is fabricated in a CMOS process. The back etching may be performed using either DRIE (resulting in near vertical sidewalls), or by using anisotropic etching (resulting in slanting sidewalls).

The plasmonic layer (or the patterned layer including laterally spaced structures) may be formed either above or below the thermopile, or be formed of the layer, or layers used to form all or part of the thermopile. The plasmonic layer may be embedded within the membrane, or be on top of the membrane. Also there may be a plurality of plasmonic layers which are all situated above the thermopile. Alternatively, the plasmonic layers may be situated below the thermopile.

According to another aspect of the invention there is provided a method of manufacturing an IR device, the method comprising: forming a dielectric membrane on a silicon substrate comprising an etched portion; and forming at least one patterned layer within or on the dielectric membrane for controlling IR emission or IR absorption of the IR device, wherein the at least one patterned layer comprises laterally spaced structures.

BRIEF DESCRIPTION OF THE DRAWINGS

In order that the invention may be more fully understood, a number of embodiments of the invention will now be described, by way of example, with reference to the accompanying drawings, in which.

DETAILED DESCRIPTION OF THE PREFERRED EMBODIMENTS

Figure 1:
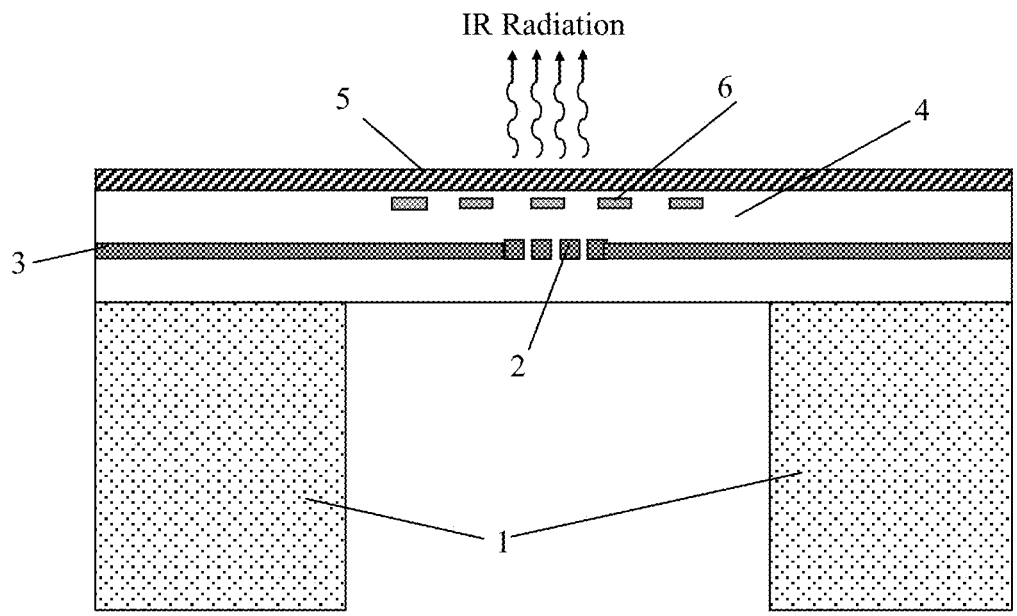
FIG. 1 shows the schematic cross-section of the IR emitter with the heater embedded within the membrane, and a layer above the heater, but within the membrane which is patterned a periodic structure.

FIG. 1 shows a schematic cross section of an IR source with a plasmonic layer (or a patterned layer having laterally spaced structures) to enhance the IR emission. There is provided a membrane layer 4, 5 which is supported on a silicon substrate 1, the membrane layer including a dielectric layer 4 and a passivation layer 5. A tungsten resistive heater 2 is formed within the membrane 4, 5 and connected to the rest of a chip by tracks 3. The membrane includes a plasmonic layer 6 including a periodic pattern (or laterally spaced structures) and is located above the heater 2. The silicon substrate is etched by deep reactive ion etching (DRIE) which results in near vertical sidewalls. The heater 2 may be made from single crystal silicon, polysilicon, or a metal such as platinum, or a CMOS metal such as aluminium, tungsten, titanium, molybdenum or copper. The plasmonic layer has a periodic structure and may be made from polysilicon, a metal or a CMOS metal.

Figure 2:
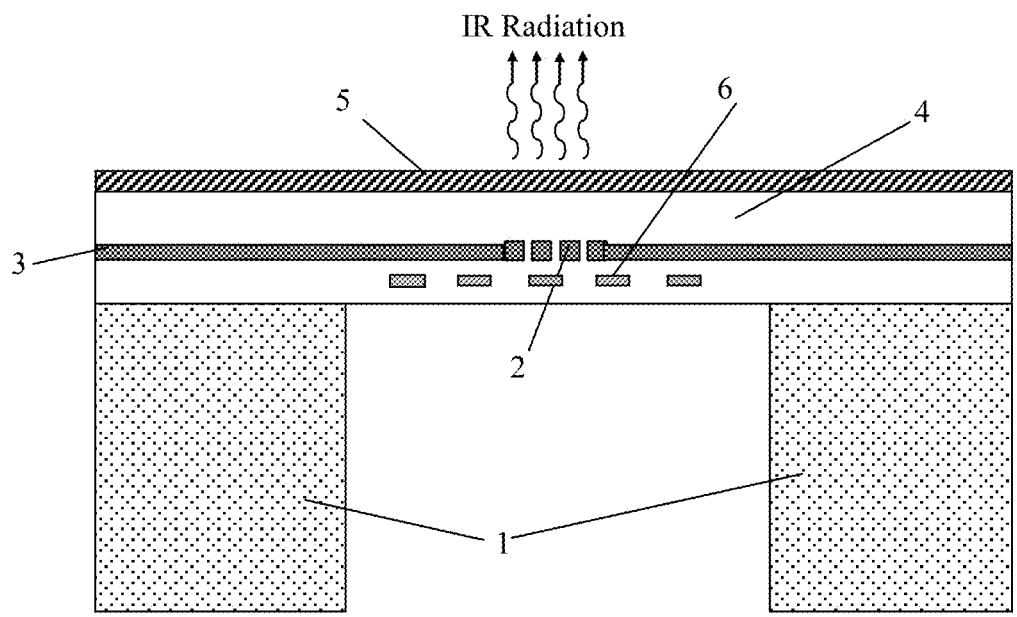
FIG. 2 shows the schematic cross-section of the IR emitter with the heater embedded within the membrane, and a layer below the heater, but within the membrane which is patterned a periodic structure.

FIG. 2 shows a schematic cross section of an IR source where the plasmonic layer 6 is below the heater 2, and made from single crystal silicon, polysilicon, a metal such as platinum, or a CMOS metal.

Figure 3:
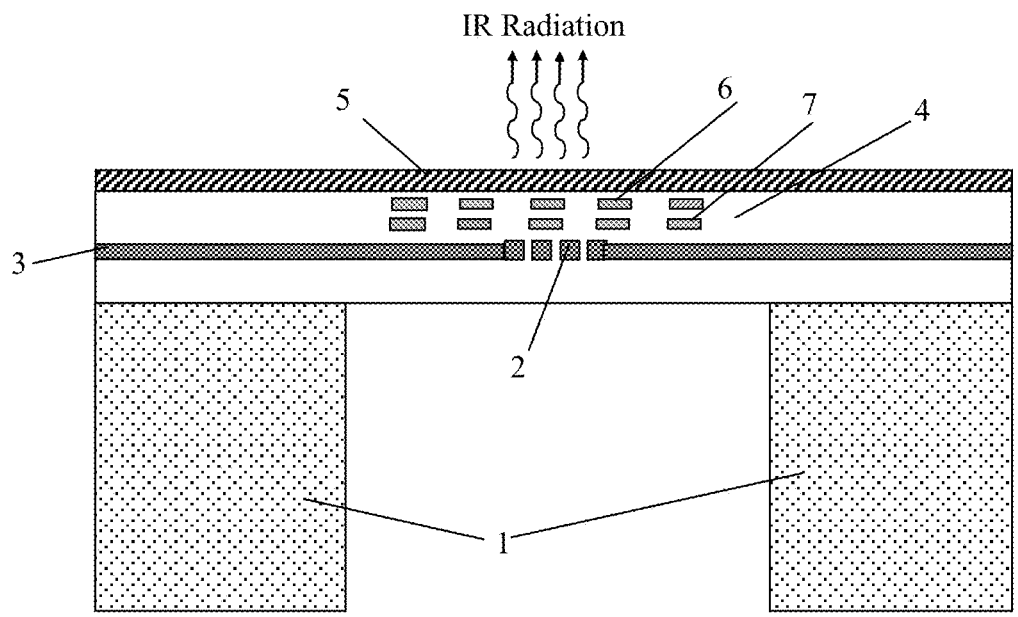
FIGS. 3-4 shows the schematic cross-section of the IR emitter where there are 2 layers with the periodic structures.

FIG. 3 shows a schematic cross section of an IR source where there are 2 plasmonic layers 6, 7, both of which have an identical pattern.

Figure 4:
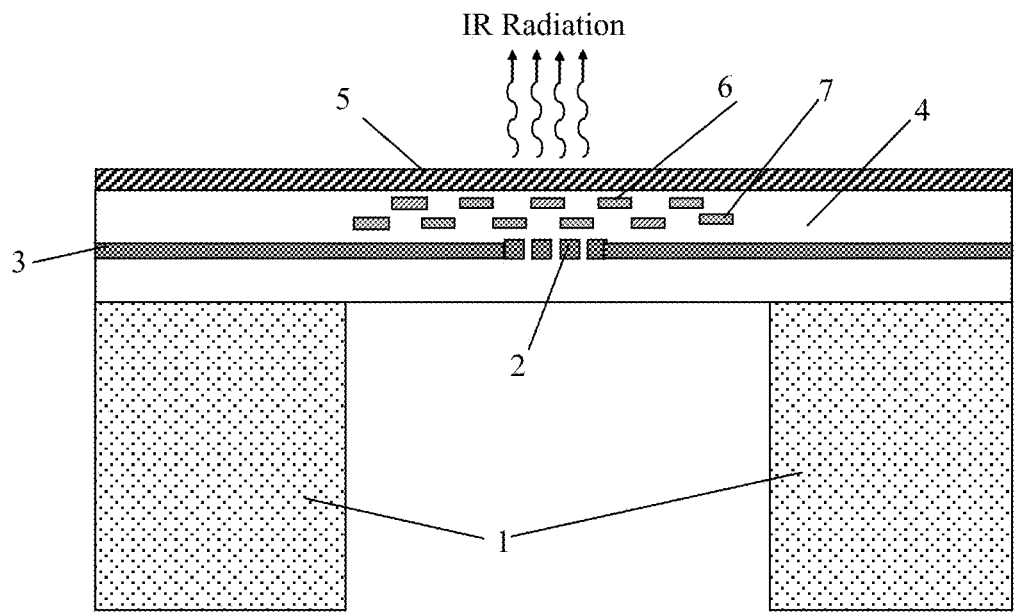

FIG. 4 shows a schematic cross section of an IR source where there are two plasmonic layers 6, 7 with a different pattern.

Figure 5:
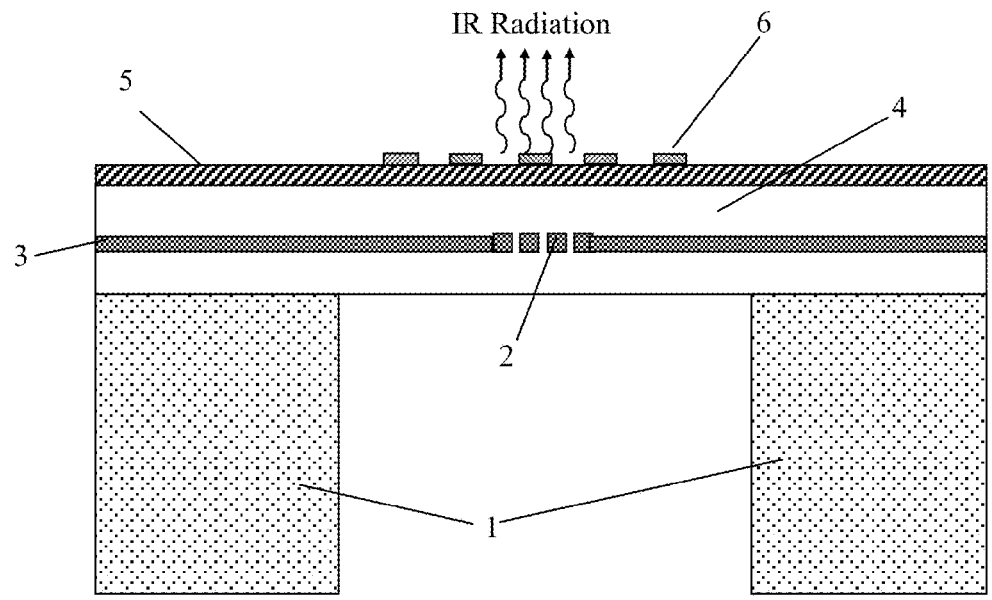
FIG. 5 shows the schematic cross-section of the IR emitter where the layer with the periodic structure is above the membrane.

FIG. 5 shows a schematic cross section of an IR source where the plasmonic layer is above the membrane. If using a CMOS process, this will typically be performed after the CMOS process and may include a metal such as platinum or gold, or a CMOS metal. It will be appreciated that the term "CMOS metal" refers to metals which are compatible in the industry standard CMOS processing steps.

Figure 6:
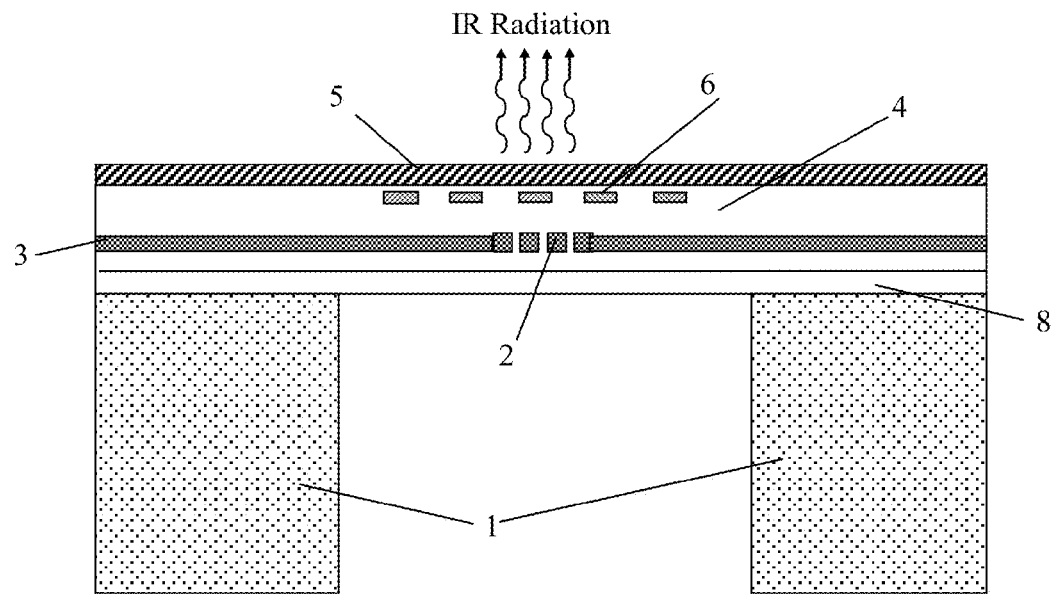
FIG. 6 shows the schematic cross-section of the IR emitter where the substrate is an SOI substrate.

FIG. 6 shows a schematic cross section of an IR emitter with a plasmonic structure where the starting substrate was an SOI wafer. This results in a buried oxide 8 also present as part of the membrane. In this example, the membrane therefore includes the buried oxide 8, dielectric layer 4 and the passivation layer 5.

Figure 7:
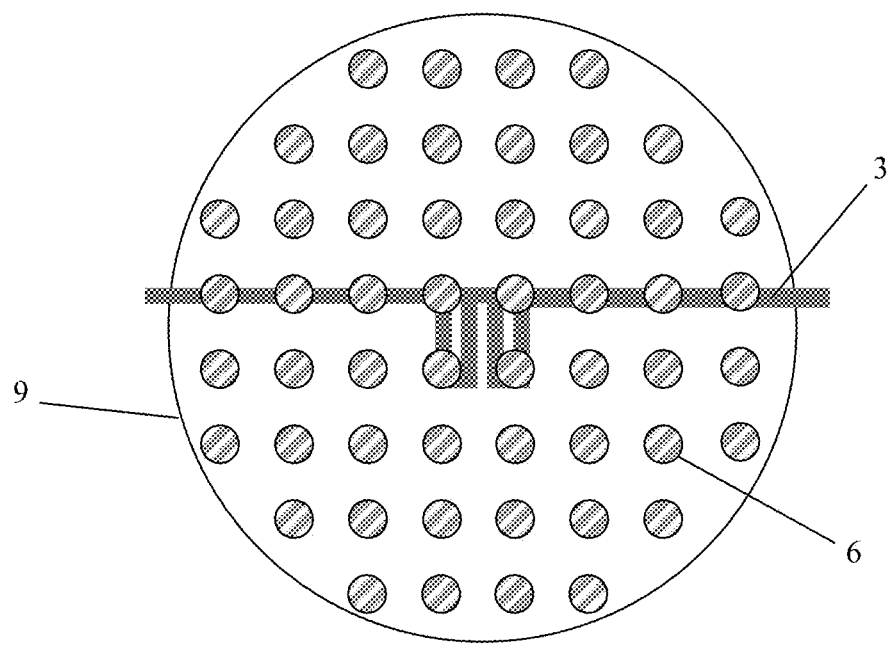
FIG. 7-13 show the top view of the IR emitter with different heater and membrane shapes and different configurations of the periodic patterns.

FIG. 7 shows the top view of an IR emitter with a plasmonic layer 6, having a circular membrane 9 and a rectangular meander shaped heater. The plasmonic layer 6 is patterned as circular dots in a square pattern, and the pattern covers the whole membrane.

Figure 8:
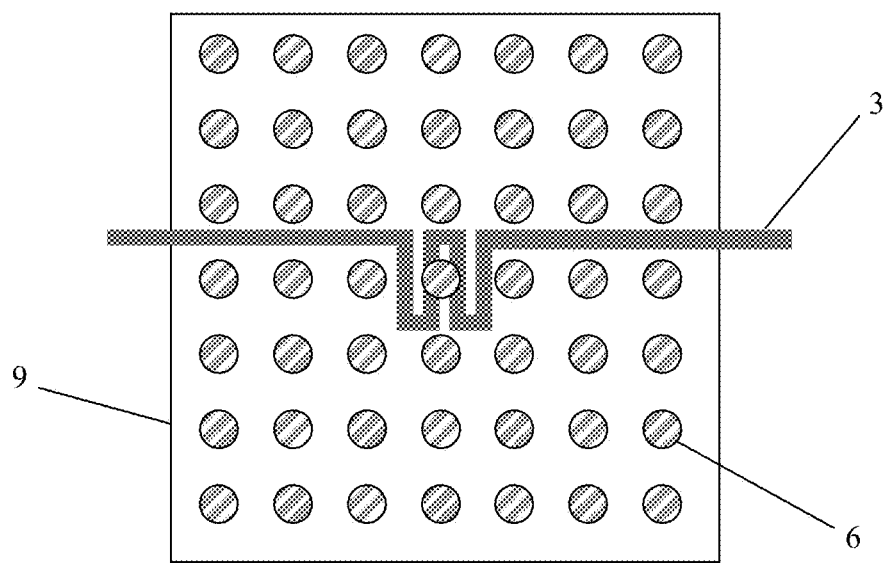

FIG. 8 shows the top view of an IR emitter with a plasmonic layer 6, having a square membrane 9 and a rectangular meander shaped heater. The plasmonic layer 6 is patterned as circular dots in a square pattern.

Figure 9:
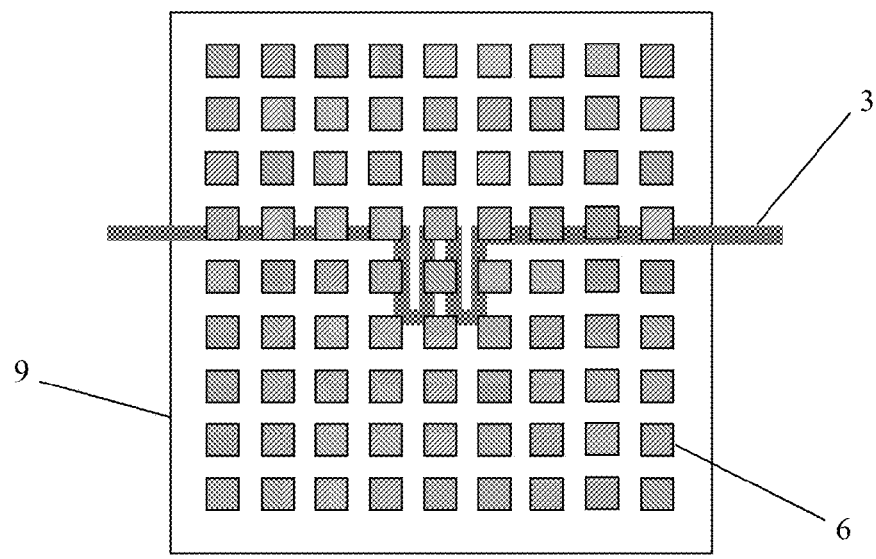

FIG. 9 shows the top view of an IR emitter with a plasmonic layer 6, having a square membrane 9 and a rectangular meander shaped heater. The plasmonic layer 6 is patterned as square dots in a square pattern.

Figure 10:
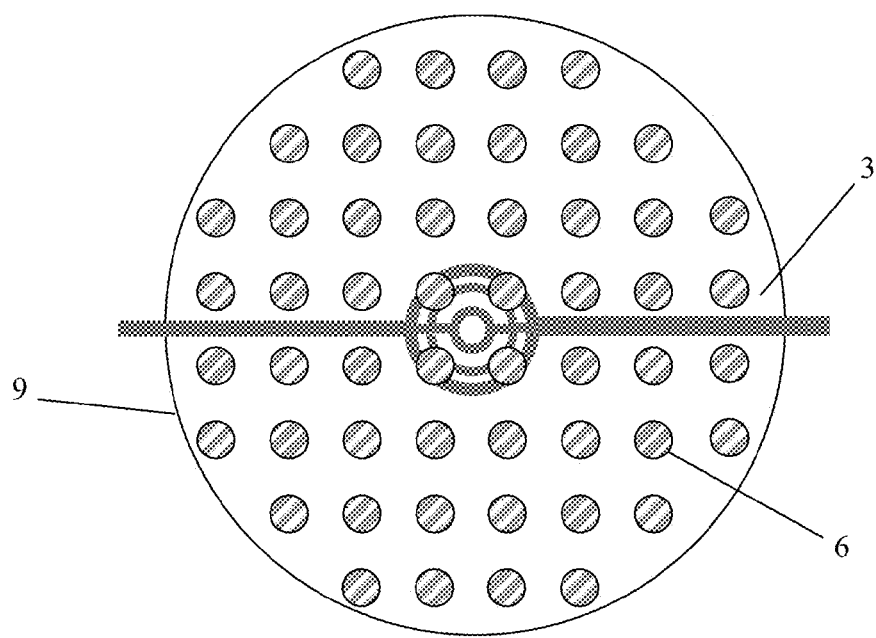

FIG. 10 shows the top view of an IR emitter with a plasmonic layer 6, having a circular membrane 9 and a circular multi-ringed shaped heater. The plasmonic layer 6 is patterned as circular dots in a square pattern.

Figure 11:
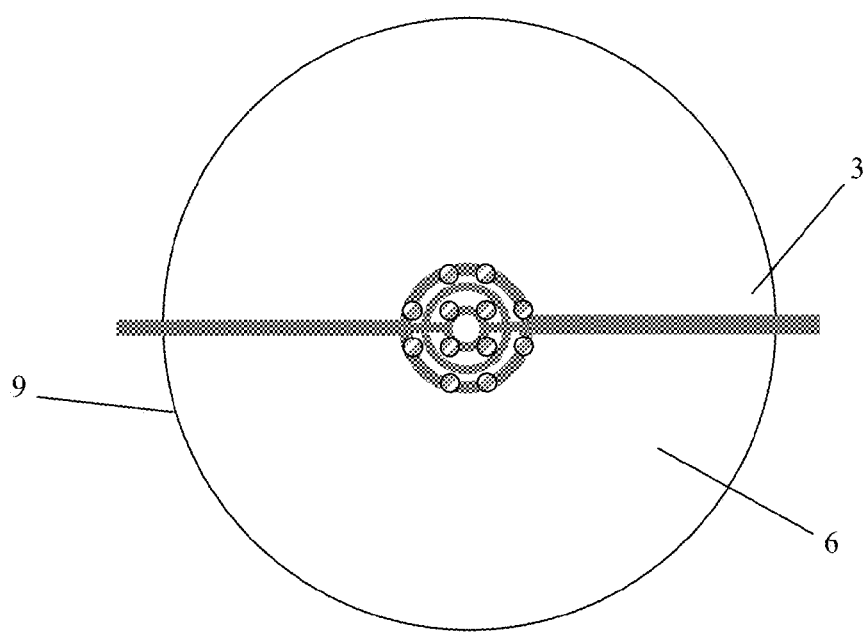

FIG. 11 shows the top view of an IR emitter with a plasmonic layer 6, having a circular membrane 9 and a circular multi-ringed shaped heater. The plasmonic layer 6 is patterned as circular dots in a square pattern, and the layer is only present within the heater region.

Figure 12:
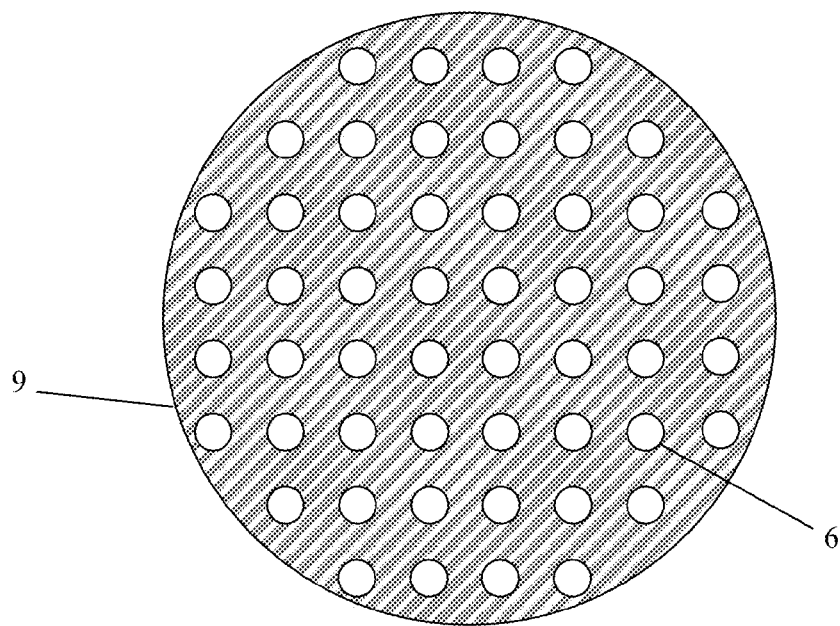

FIG. 12 shows the top view of an IR emitter with a plasmonic layer 6, having a circular membrane 9 and a circular multi-ringed shaped heater. The plasmonic layer 6 is patterned as circular holes in a square pattern.

Figure 13:
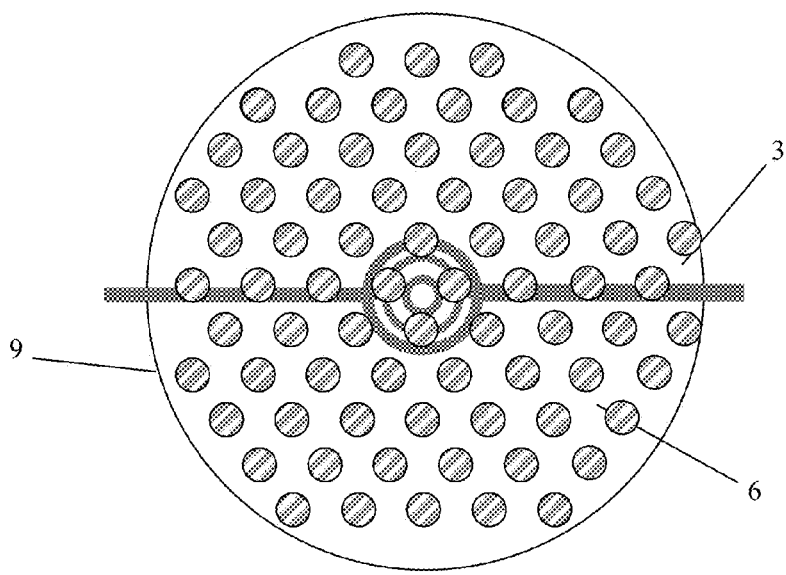

FIG. 13 shows the top view of an IR emitter with a plasmonic layer 6, having a circular membrane 9 and a circular multi-ringed shaped heater. The plasmonic layer 6 is patterned as circular dots in a hexagonal pattern.

Figure 14:
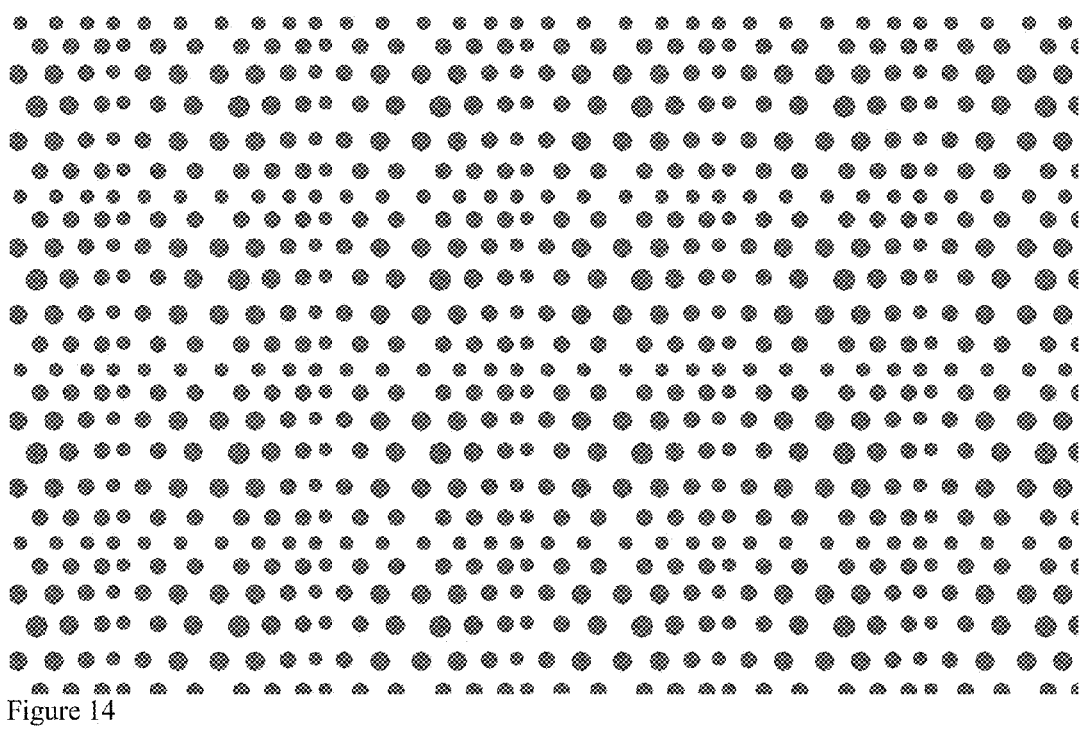
FIG. 14 shows a periodic pattern with the spacing and size of dots varying with the pattern.

FIG. 14 shows a plasmonic layer where there are circular dots with different sizes, and different spacing between them. However, there is still a periodic repetition after a certain number of dots.

The different patterns of the plasmonic layer shown in FIG. 7-14 are given by way of examples only, and in no way limit the possible patterns according to this invention. Similarly many variations of heater and membrane shapes/sizes are shown, but these are also given by way of examples. To one well versed in the art many possible designs can be determined.

Figure 15:
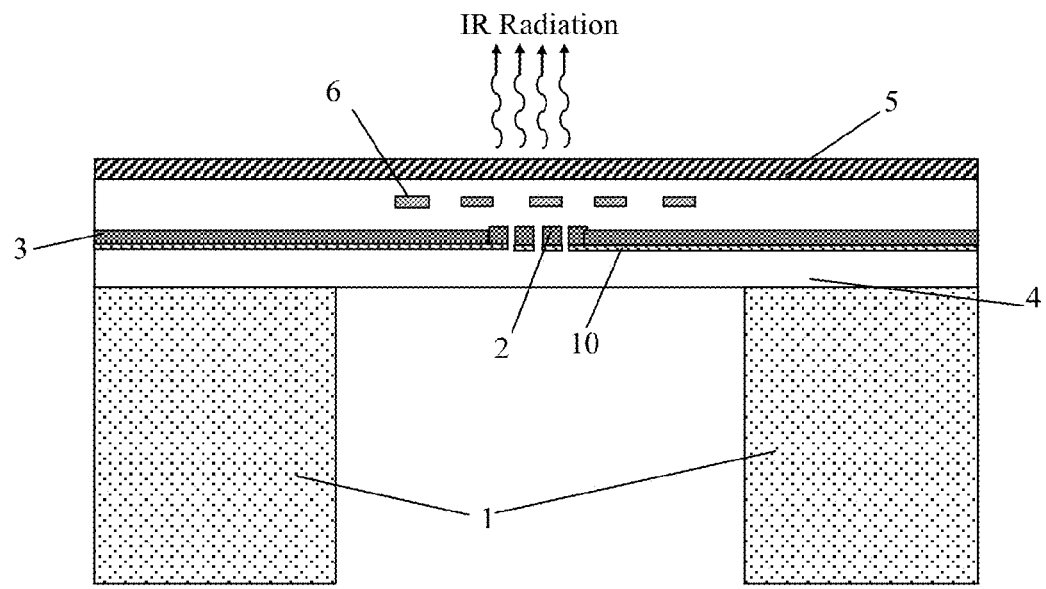
FIG. 15 shows the IR emitter where this is a thin adhesion layer underneath the heater.

FIG. 15 shows the schematic cross section an IR source with a plasmonic layer 6 where there is an underlying layer 10 below the heater 3 which acts as a diffusion barrier, or an adhesive layer.

Figure 16:
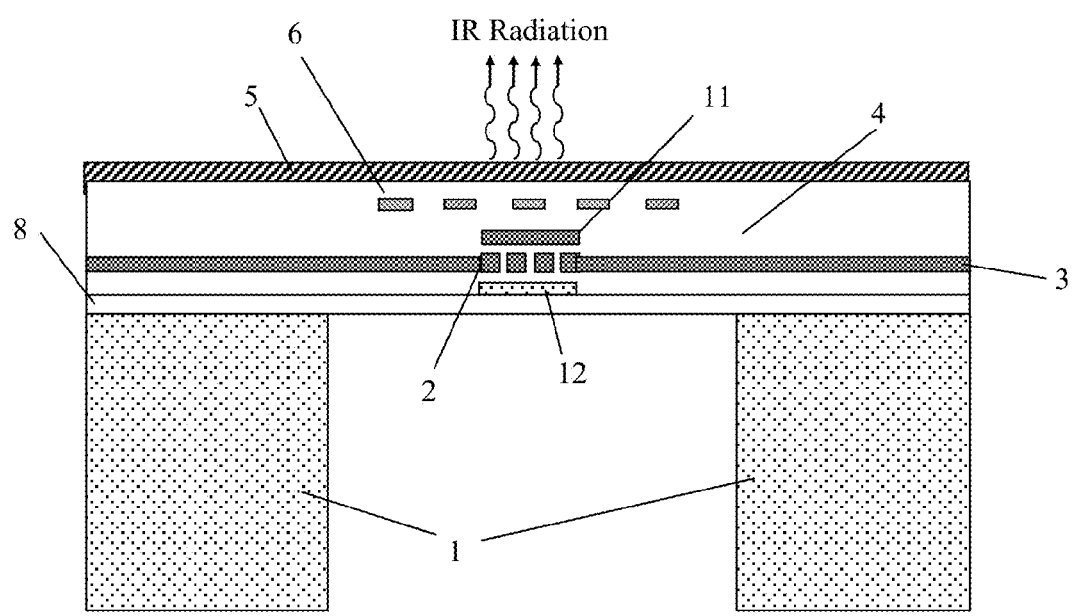
FIG. 16 shows an IR emitter with a silicon and a metal heat spreading plate.

FIG. 16 shows the schematic cross section an IR source with a plasmonic layer 6 where there are two heat spreading plates 11, 12 above and below the heater 3.

Figure 17:
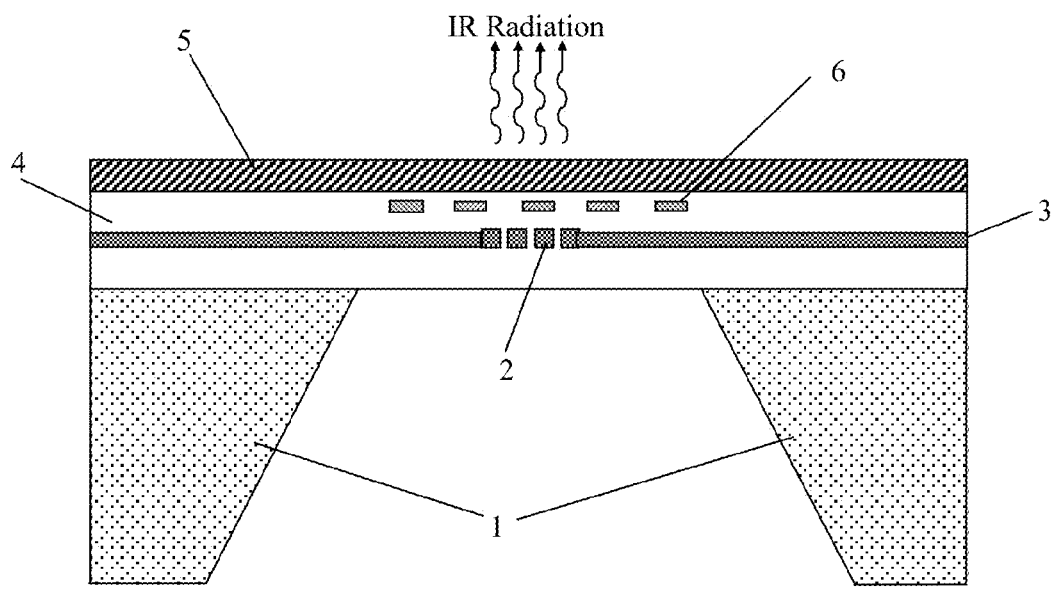
FIG. 17 shows an IR emitter where the back-etching has been done by wet anisotropic etching resulting in slanting sidewalls.

FIG. 17 shows the schematic cross section an IR source with a plasmonic layer 6 where the back side etching has been performed by anisotropic wet etching, resulting in slanting sidewalls of the trench.

Figure 18:
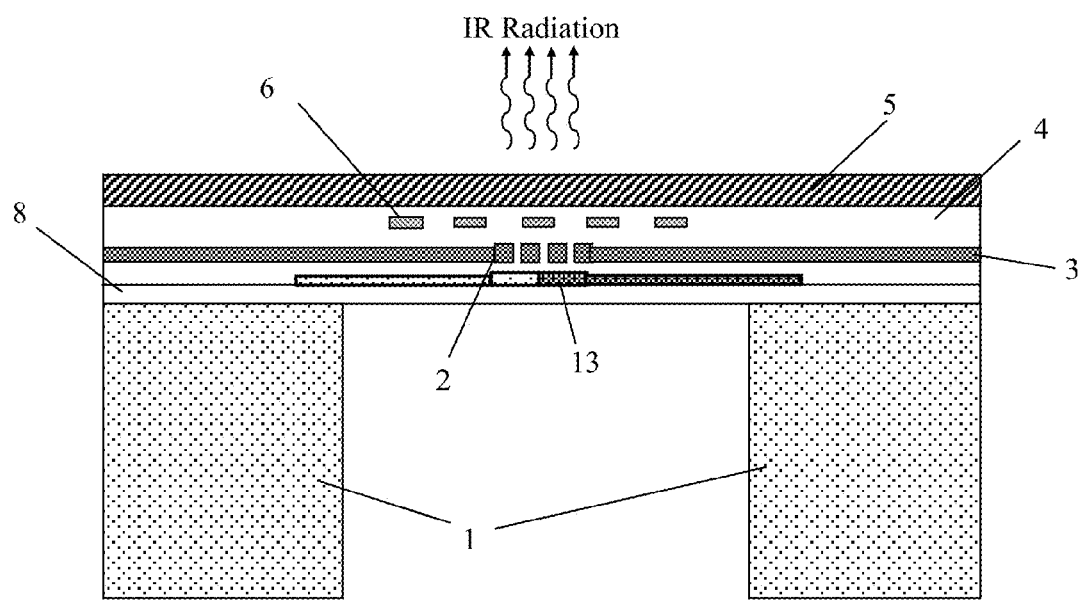
FIG. 18 shows an IR emitter where the starting substrate is SOI and there is a diode embedded within the membrane.

FIG. 18 shows the schematic cross section an IR source with a plasmonic layer 6 where there is a temperature sensing diode 13 embedded within the membrane. This diode will be made is the starting wafer is an SOI wafer.

Figure 19:
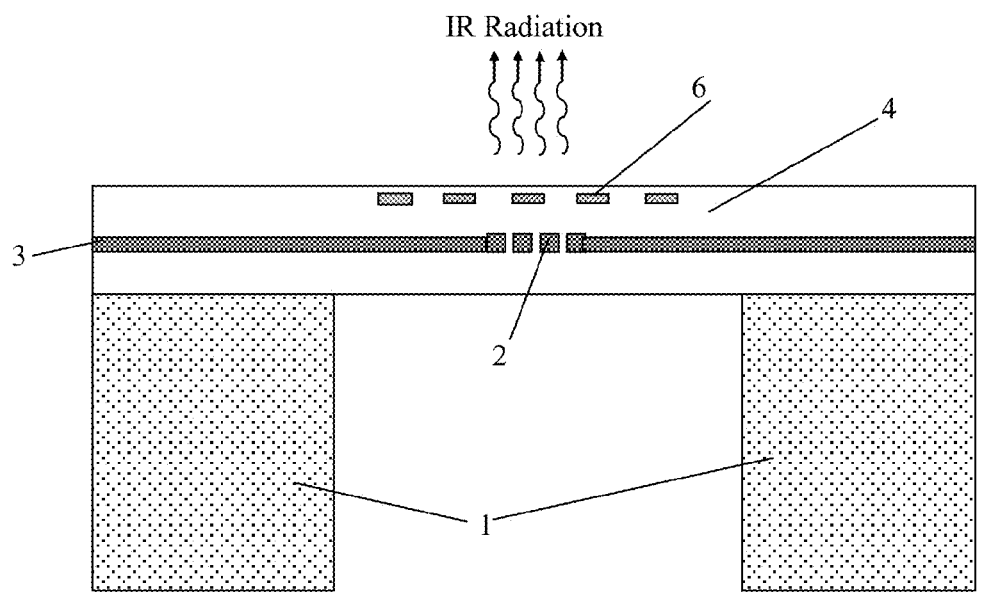
FIG. 19 shows an IR emitter where there is no passivation layer, but just the layer of the membrane.

FIG. 19 shows the schematic cross section an IR source with a plasmonic layer where there is no passivation and the dielectric layers form the membrane.

Figure 20:
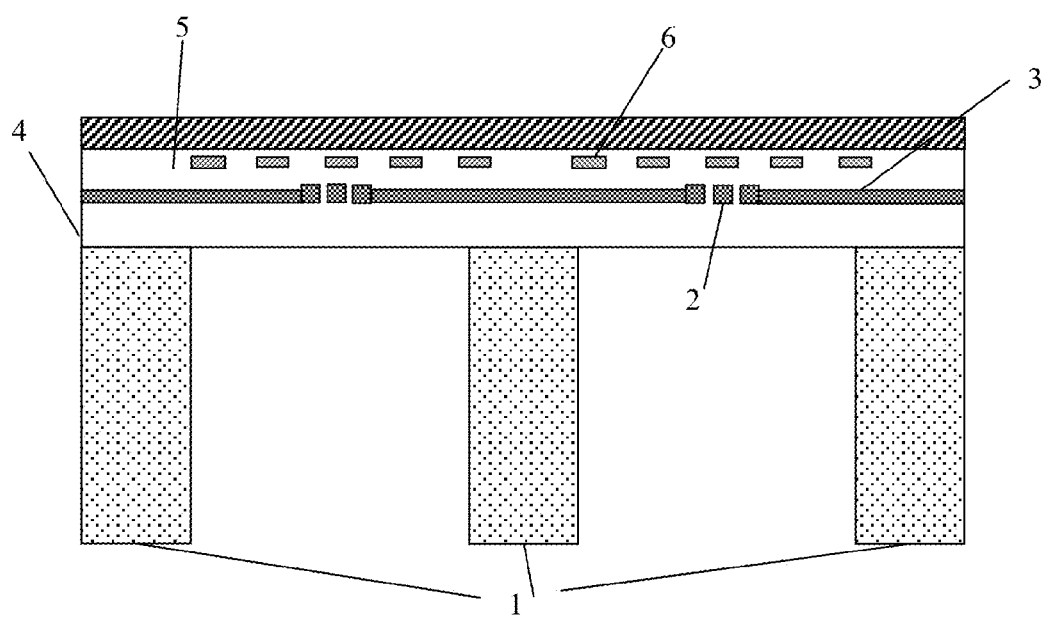
FIG. 20 shows the schematic cross-section of an array of two IR emitters side by side on the same chip.

FIG. 20 shows the schematic cross section of an array of two IR sources with plasmonic layers. Because of the vertical sidewalls these can be very close to each other.

Figure 21:
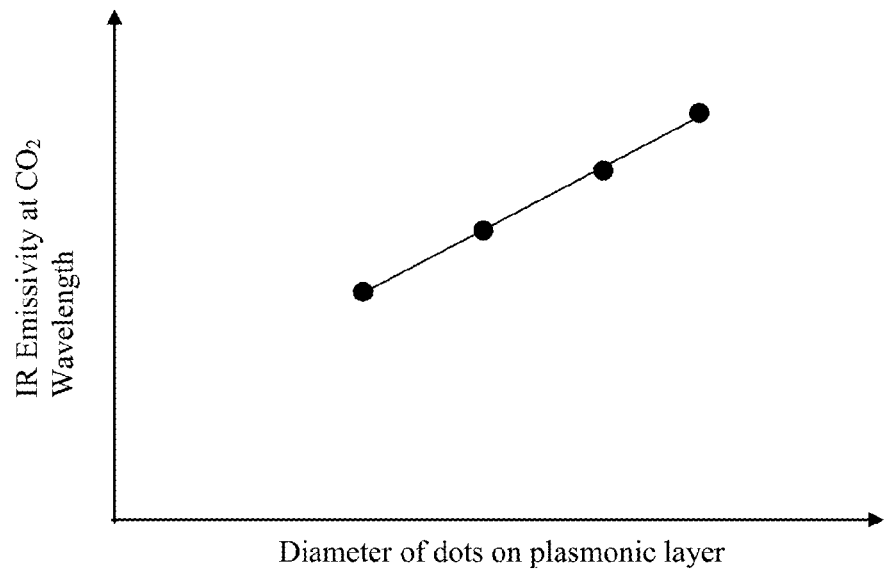
FIGS. 21 and 22 show some possible trends at carbon dioxide absorption wavelengths (near 4.26 µm) when varying the parameters of the plasmonic layer structure.

FIG. 21 shows the trends on particular device which show that the emission at the carbon dioxide wavelength increases as the diameter of the dots in increased.

Figure 22:
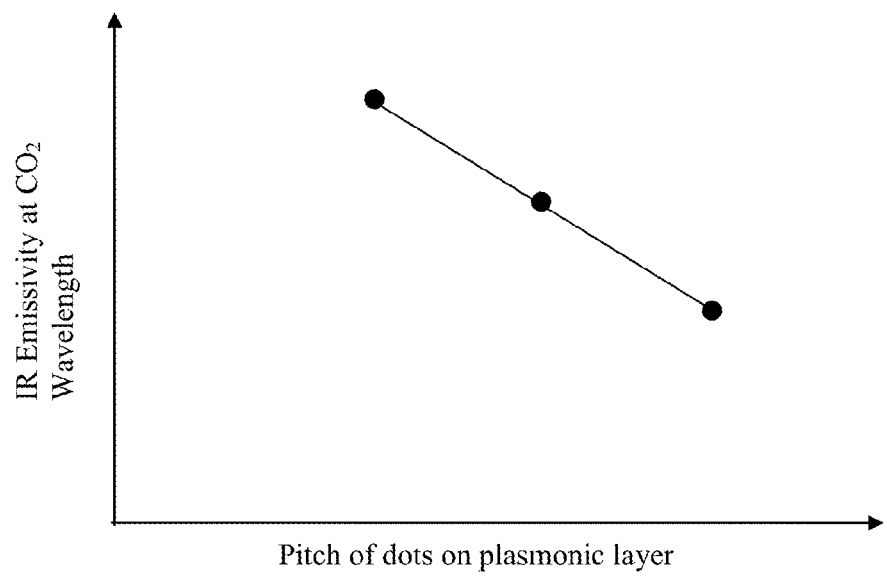

FIG. 22 shows the trends on particular device which show that the emission at the carbon dioxide wavelength decreases as the pitch of the dots in increased.

Figure 23:
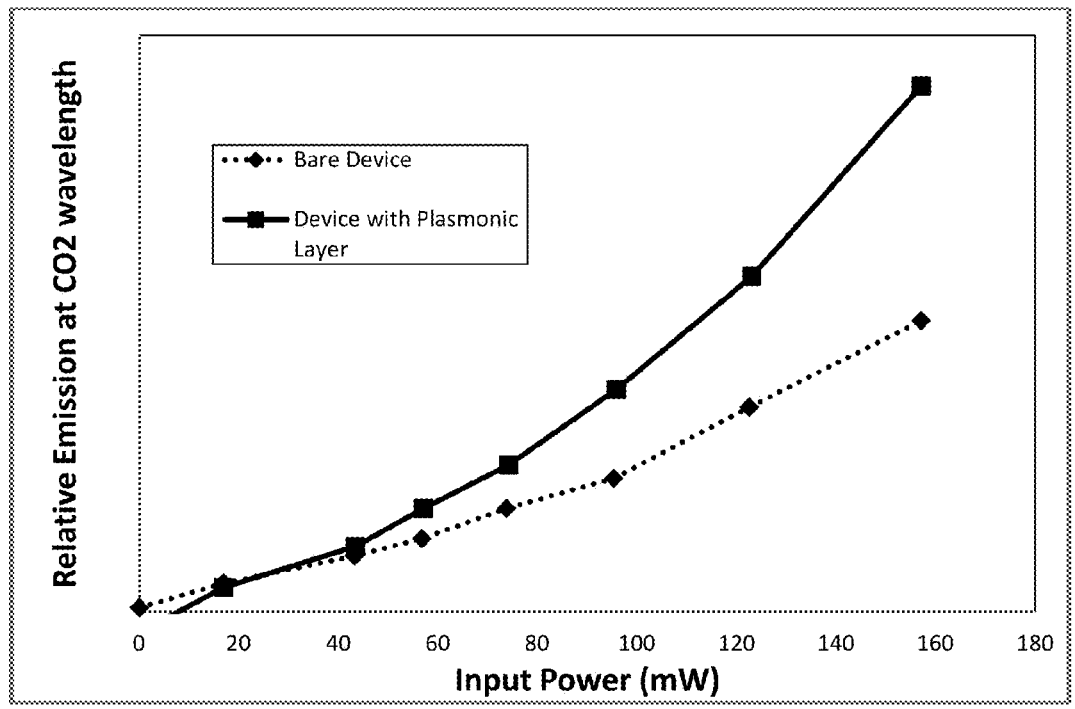
FIG. 23 shows the improvement in the carbon dioxide absorption wavelengths (near 4.26 µm) which are cause due to the presence of the plasmonic layer.

FIG. 23 shows graph with the emission for two devices with and without the plasmonic layer measured at the plasmonic wavelength, where the device with the plasmonic layer has a significantly higher emission.

Figure 24:
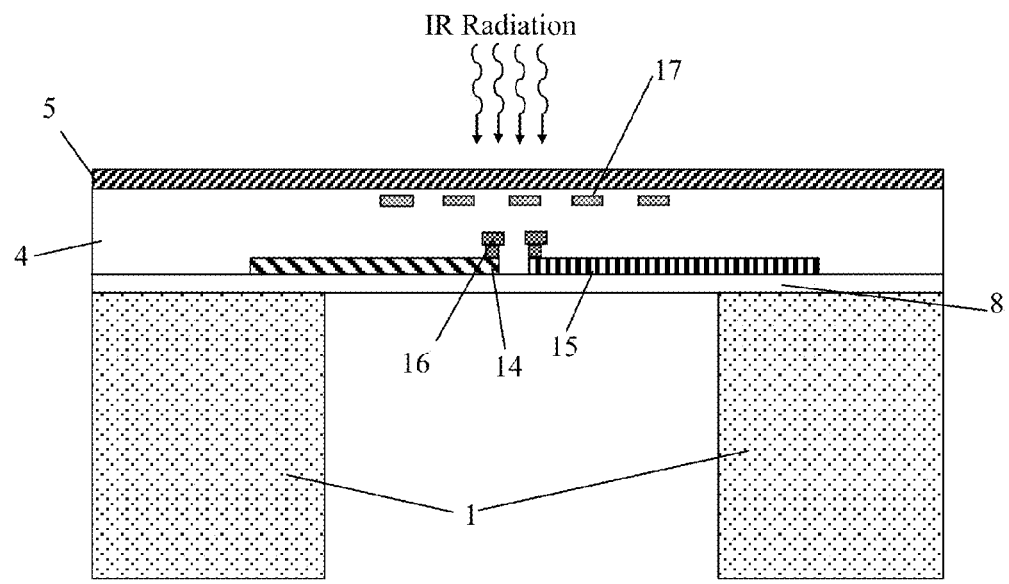
FIGS. 24 and 25 show the schematic cross-section of a thermopile based IR detector with one or more plasmonic layers to enhance the absorption at particular wavelengths.

FIG. 24 shows the schematic cross-section of an IR detector with a plasmonic layer 17. The IR detector includes thermopile, and the thermopile includes several thermocouples. The thermocouples in this figure includes a single crystal P+ silicon 14 and single crystal N+ silicon 15. Metal 16 is used to form the junction of the thermocouple. The plasmonic layer 17 is used to enhance the absorption of the detector at either a particular wavelength, or over a range of wavelengths. While this figure shows that the thermocouple includes single crystal P+ silicon and single crystal N+ silicon, it can also include polysilicon or a CMOS metal, or a non-CMOS metal.

Figure 25:
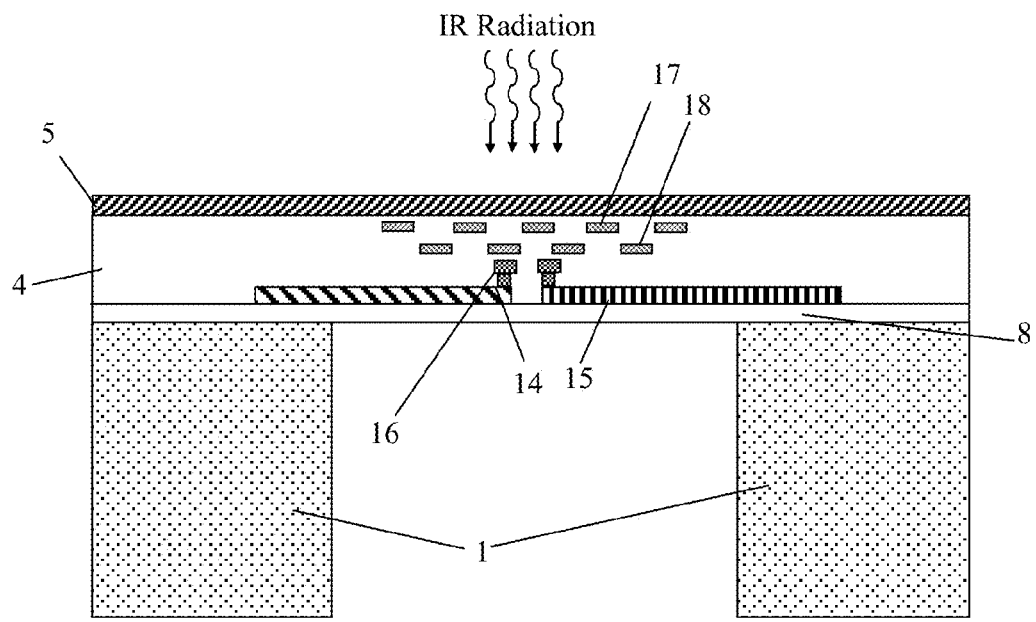

FIG. 25 shows the schematic cross-section of an IR detector with two plasmonic layers 16 and 17, which are used to enhance the absorption.

Figure 26:
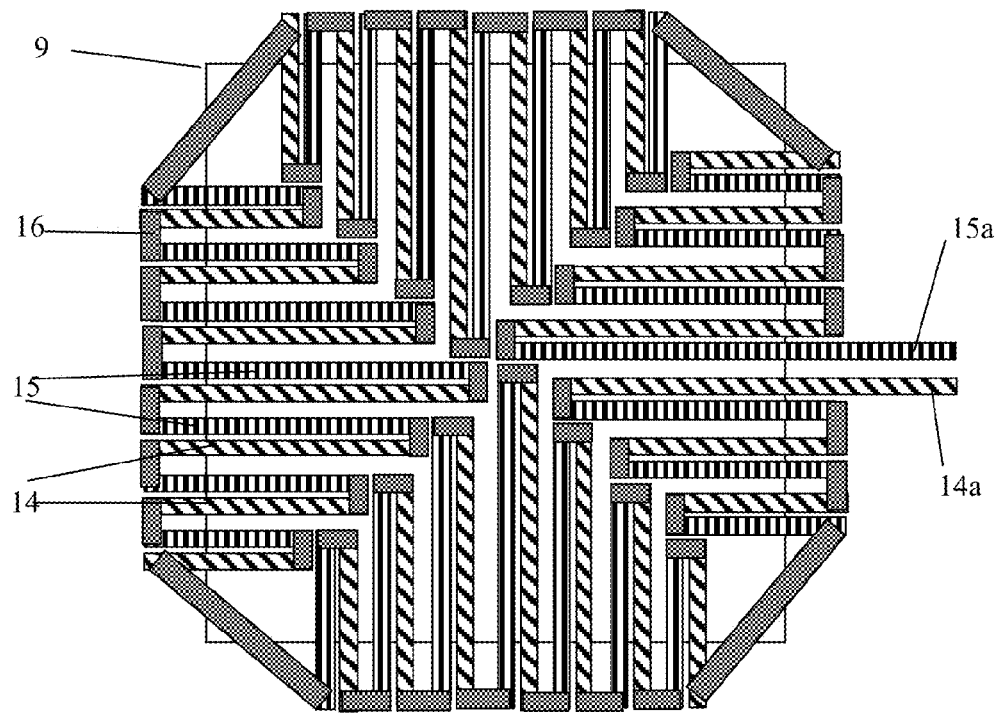
FIG. 26 shows the top view of a thermopile.

FIG. 26 shows the top view of the thermopile to show one possible arrangement of the thermocouples including single crystal P+ silicon 14 and single crystal N+ silicon 15, and a metal layer 16 used to form the hot and cold junctions. The 14a and 15a form the two end terminals of the thermopile.

Figure 27:
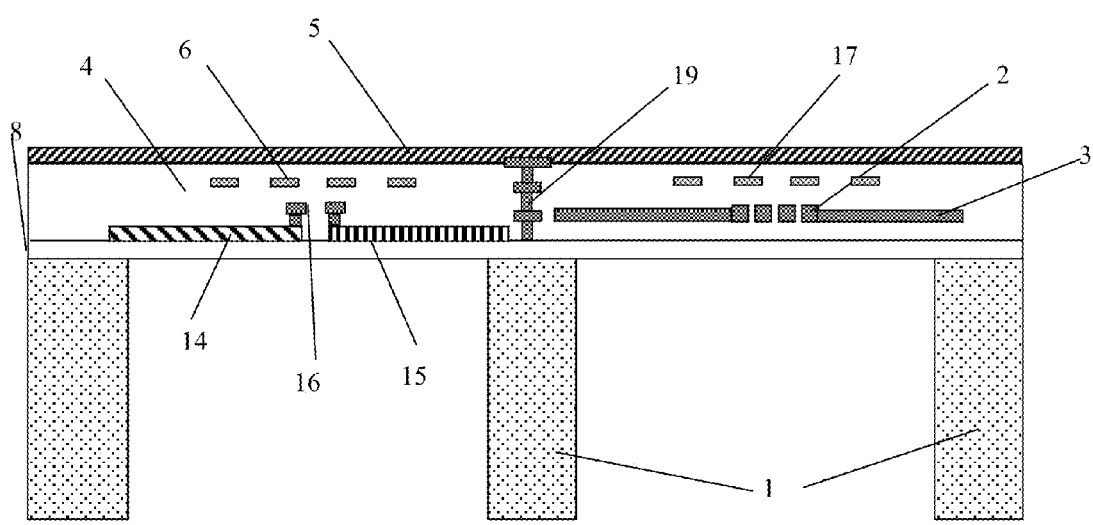
FIG. 27 shows a schematic cross-section of a chip with both the IR emitter and detector on the same chip and having plasmonic layers to improve emission and absorption.

FIG. 27 shows the schematic cross-section of a chip with the IR emitter and IR detector on the same chip, where both devices have a plasmonic layer. A partition 19 formed of metal layers is used to reduce cross-talk between the emitter and detector, and prevent IR emission going directly through the dielectric layers to the IR detector.

The invention claimed is:

1. An infra-red (IR) device comprising:
   a dielectric membrane formed on a silicon substrate, wherein the silicon substrate comprises an etched portion; and
   at least one patterned layer formed within or on the dielectric membrane for controlling IR emission or IR absorption of the IR device,
   wherein the at least one patterned layer comprises laterally spaced structures.

2. An IR device according to claim 1, wherein the device is an IR source in which the patterned layer is configured to control the IR emission of the device.

3. An IR device according to claim 2, further comprising a resistive heater embedded within the dielectric membrane.

4. An IR device according to claim 3, wherein the resistive heater comprises single crystal silicon or polysilicon.

5. An IR device according to claim 3, wherein the resistive heater comprises a CMOS-based metal comprising aluminium, copper, titanium, molybdenum or tungsten.

6. An IR device according to claim 3, wherein the resistive heater comprises platinum.

7. An IR device according to claim 3, further comprising a titanium/titanium nitride layer adjacent the resistive heater to act as an adhesive, or anti diffusion layer.

8. An IR device according to claim 1, wherein the dielectric membrane comprises one or more layers of silicon dioxide and/or silicon nitride.

9. An IR device according to claim 1, wherein each structure comprises a metal comprising gold or platinum, or a CMOS-based metal chosen from among aluminium, copper, titanium, molybdenum and tungsten.

10. An IR device according to claim 9, further comprising a titanium/titanium nitride layer adjacent the patterned layer to act as an adhesive, or anti diffusion layer.

11. An IR device according to claim 1, wherein the patterned layer comprises single crystal silicon or polysilicon.

12. An IR device according to claim 3, wherein the patterned layer comprising the laterally spaced structures is below the heater.

13. An IR device according to claim 3, wherein the patterned layer comprising the laterally spaced structures is above the heater.

14. An IR device according to claim 1, wherein the patterned layer comprising the laterally spaced structures is above the membrane.

15. An IR device according to claim 3, wherein the patterned layer forms part of the layer which forms the resistive heater.

16. An IR device according to claim 1, wherein the laterally spaced structures are a pattern of dots, and wherein the dots have a shape of a circle, a rectangle, a square, a trapezoid, a hexagon, or a cross.

17. An IR device according to claim 1, wherein the laterally spaced structures are a pattern of holes, and wherein the holes have a shape of a circle, a rectangle, a square, a trapezoid, a hexagon, or a cross.

18. An IR device according to claim 1, wherein the laterally spaced structures have a square, rectangular or hexagonal pattern.

19. An IR device according to claim 3, further comprising a plurality of patterned layers each having laterally spaced structures.

20. An IR device according to claim 19, wherein all of the plurality of layers are above the resistive heater within the dielectric membrane.

21. An IR device according to claim 19, wherein all of the plurality of layers having the laterally spaced structures have the same pattern.

22. An IR device according to claim 19, wherein each of the patterned layers having the laterally spaced structures has a different pattern.

23. An IR device according to claim 1, further comprising a temperature sensor located within the dielectric membrane.

24. An IR device according to claim 23, wherein the temperature sensor is a diode, or a resistive temperature sensor comprising a metal or polysilicon or single crystal silicon.

25. An IR device according to claim 3, further comprising a plurality of resistive heaters located within the membrane.

26. An IR device according to claim 1, further comprising a spreading plate located within the membrane, the spreading plate comprising single crystal silicon, polysilicon or a metal.

27. An IR device according to claim 3, wherein the IR source is a CMOS based IR source in which the resistive heater comprises a CMOS interconnect metal, and the dielectric membrane comprises CMOS dielectric layers.

28. An IR device according to claim 27, wherein the silicon substrate is a bulk silicon substrate.

29. An IR device according to claim 27, wherein the silicon substrate is an SOI substrate.

30. An IR device according to claim 27, further comprising circuitry integrated on the same chip as the IR source.

31. An IR device according to claim 3, wherein the resistive heater is ring, meander, multiring or spiral shaped.

32. An IR device according to claim 3, wherein the heater is circular.

33. An IR device according to claim 3, wherein the heater is rectangular.

34. An IR device according to claim 3, wherein the membrane is circular.

35. An IR device according to claim 1, wherein the membrane is a square or rectangular.

36. An IR device according to claim 1, wherein the membrane has a square or rectangular shape with rounded corners.

37. An IR device according to claim 1, wherein the patterned layers comprise circular dots having a constant diameter which is optionally in the range of about 0.5 µm to 10 µm, and a constant pitch which is optionally in the range of about 1 to 20 µm.

38. An IR device according to claim 1, wherein the patterned layer is shaped for the lower wavelengths between 2 to 5 µm, such as for carbon dioxide absorption wavelengths.

39. An IR device according to claim 1, wherein the patterned layer is shaped for the higher wavelengths between 5-15 µm in a Mid-IR region.

40. An IR device according to claim 27, wherein the heater is formed from a first metal layer formed in the CMOS processing steps.

41. An IR device according to claim 40, wherein the patterned layer is formed from a top metal layer formed in the CMOS processing steps.

42. An IR device according to claim 41, wherein the patterned layer comprises circular dots in a hexagonal pattern and the hexagonal pattern is optimised such that the patterned layer is configured to emit at the carbon dioxide absorption wavelength.

43. An array of IR sources incorporating an IR source according to claim 2, wherein the array of IR sources is arranged on the same chip.

44. An array of IR sources according to claim 43, wherein each IR source in the array is identical.

45. An array IR source according to claim 44, wherein the IR sources in the array are different.

46. An IR device according to claim 1, wherein the IR device is an IR detector in which the patterned layer is configured to control the IR absorption of the device.

47. An IR device according to claim 46, further comprising a thermopile located within the dielectric membrane, the thermopile comprising a plurality of thermocouples electrically connected in series with one junction inside the membrane and another junction outside the membrane.

48. An IR device according to claim 47, wherein the thermocouple comprises at least two materials selected from: single crystal silicon, polysilicon, a non-CMOS metal selected from platinum or gold, and a CMOS metal selected from tungsten, copper, aluminium, molybdenum or titanium.

49. An IR device according to claim 47, wherein each thermocouple has a same length.

50. An IR device according to claim 47, wherein each thermocouple has a different length.

51. An IR device according to claim 47, wherein the patterned layer is formed of the same material forming the thermopile of the IR detector.

52. An IR device according to claim 46, wherein the IR detector is on the same chip as an IR emitter.

53. A method of manufacturing an IR device, the method comprising:
    forming a dielectric membrane on a semiconductor substrate, wherein the semiconductor substrate comprises an etched portion; and
    forming at least one patterned layer within or on the dielectric membrane for controlling IR emission or IR absorption of the IR device, wherein the at least one patterned layer comprises laterally spaced structures.

54. A method according to claim 53, wherein the dielectric membrane is formed by anisotropic wet etching resulting is slanting sidewalls of the trench.

55. A method according to claim 53, wherein the dielectric membrane is formed by Deep Ion Etching (DRIE), resulting in near vertical sidewalls of the trench.

* * * * *